United States Patent [19]
Jenne

[11] Patent Number: 5,914,895
[45] Date of Patent: Jun. 22, 1999

[54] NON-VOLATILE RANDOM ACCESS MEMORY AND METHODS FOR MAKING AND CONFIGURING SAME

[75] Inventor: Fredrick B. Jenne, Los Gatos, Calif.

[73] Assignee: Cypress Semiconductor Corp., San Jose, Calif.

[21] Appl. No.: 08/926,611

[22] Filed: Sep. 10, 1997

[51] Int. Cl.$^6$ .................................................. G11C 14/00
[52] U.S. Cl. ........................... 365/185.08; 365/185.28; 365/185.26; 365/208; 365/184; 365/185.05
[58] Field of Search .................................... 365/156, 154, 365/185.08, 185.01, 185.26, 185.28, 208, 212, 184, 185.05

[56] References Cited

U.S. PATENT DOCUMENTS

| | | | |
|---|---|---|---|
| H1414 | 2/1995 | Borgen | 380/4 |
| 4,095,281 | 6/1978 | Denes | 365/156 |
| 4,342,101 | 7/1982 | Edwards | 365/154 |
| 4,354,255 | 10/1982 | Stewart | 365/154 |
| 4,435,786 | 3/1984 | Tickle | 365/154 |
| 4,510,584 | 4/1985 | Dias et al. | 365/203 |
| 4,538,246 | 8/1985 | Wang et al. | 365/226 |
| 4,638,465 | 1/1987 | Rosini et al. | 365/228 |
| 5,353,248 | 10/1994 | Gupta | 365/154 |
| 5,365,475 | 11/1994 | Matsumura et al. | 365/154 |
| 5,523,971 | 6/1996 | Rao | 365/185.07 |
| 5,648,930 | 7/1997 | Randazzo | 365/185.07 |
| 5,677,866 | 10/1997 | Kinoshita | 365/156 |
| 5,774,397 | 6/1998 | Endoh et al. | 365/185.19 |

OTHER PUBLICATIONS

Christian E. Herdt et al., "A 256K Nonvolative Static RAM", *Simtek Corporation*, No. 5.3, pp. 1–4 (1995).

T. Ohnakado et al., "Novel Electron Injection Method Using Band–to–Band Tunneling Induced Hot Electron (BBHE) for Flash Memory with a P–Channel Cell", *IEDM* 95–279, pp. 11.5.1–11.5.4 (1995).

*Primary Examiner*—David Nelms
*Assistant Examiner*—Thong Le
*Attorney, Agent, or Firm*—Blakely Sokoloff Taylor & Zafman LLP

[57] ABSTRACT

A memory cell includes non-volatile and volatile storage elements and is configured to dynamically alter threshold voltages of the non-volatile storage elements to store states of the volatile storage elements. The volatile storage elements may be stacked gate PMOS transistors, one of which may include a gate structure having a poly-silicon control gate disposed over a poly-silicon floating gate. The control gate and floating gate may be separated by a coupling dielectric, which may be an ONO stack or a deposited oxide. The gate structure may be disposed over an active area of a substrate including a drain and a source of the PMOS transistor. The active area may be disposed in an n-well of the substrate. A first of the volatile storage elements may comprise an NMOS transistor which is formed in a p-well of the substrate. The p-well may further be disposed in an n-well. In a further embodiment, a memory cell includes non-volatile storage elements configured to power up so that a first of the non-volatile storage element undergoes band-to-band tunneling induced hot electron injection onto its floating gate while a second of the non-volatile storage elements undergoes Fowler-Nordheim tunneling of electrons off its floating gate. The memory cell may also include volatile storage elements and/or select transistors coupled to the non-volatile storage elements. In another embodiment a memory or other integrated circuit includes either of the above memory cells.

20 Claims, 10 Drawing Sheets

NON-VOLATILE RANDOM ACCESS MEMORY AND METHODS FOR MAKING AND CONFIGURING SAME

RELATED APPLICATION

This application is related to a co-pending U.S. application No. 08/885,156, filed Jun. 30, 1997 entitled "Non-Volatile Static Random Access Memory and Methods for Using Same" by K. Normal Ratnakumar and Fredrick B. Jenne and assigned to the Assignee of the present invention.

FIELD OF THE INVENTION

The present invention relates to memory devices and, in particular, those memory devices which integrate non-volatile storage capability in read/write memory architecture's.

BACKGROUND

Conventional read/write memories, for example static random access memories (SRAMs), as are commonly used in computer systems lose their stored information when power is removed from the device. Thus, a computer system which has only read/write memory will lose all of its stored information if power is removed or temporarily lost. Accordingly, computer system designers have recognized the need to back up information stored in volatile memories in the event that power is lost, e.g., during a blackout or brownout.

One way to back up a volatile memory such as an SRAM is to transfer the data stored in the SRAM to a separate non-volatile memory before the power is turned off or is about to fail. Unfortunately, such a solution requires that the data be transferred bit-by-bit between the volatile memory and the non-volatile memory. Such a data transfer, which typically occurs over a slow, serial link, cannot accommodate the large amounts of data stored in modern SRAMs (e.g., of the order of 1–4 Mbits) before a complete failure of power.

Recognizing that the serial transfer of data between volatile and non-volatile devices is not an acceptable solution, memory designers have attempted to incorporate non-volatile storage devices within conventional SRAM architecture's. In this way, the memory circuits operate in the conventional manner during usual operation but, upon an appropriate command, the data state stored in the volatile memory cells of the device can be transferred to the non-volatile storage elements of the device. When power is restored, this data state can be returned to the volatile memory elements.

Although the combination of volatile and non-volatile memory elements within the same device has been attempted, the solutions of the past tend to produce memory cells having a substantially increased area configuration. For example, memory devices such as that shown in FIG. 1 have attempted to integrate non-volatile storage elements with conventional six transistor (6T) or four transistor (4T) SRAMs. FIG. 1 illustrates a non-volatile SRAM (NVSRAM) 10 that includes a volatile storage portion 12 and a non-volatile storage portion 14. Volatile storage portion 12 is a conventional 2T-2R SRAM cell which includes resistors 16 and 18 and n-channel transistors 20 and 22. When coupled together as shown in FIG. 1, resistor-transistor pairs 16 and 20, and 18 and 22 act as latches to store a logic state of SRAM cell 10. Volatile storage portion 12 is coupled between a pair of bit lines, BL and $\overline{BL}$, through a pair of select transistors 24 and 26. Select transistors 24 and 26 couple volatile storage portion 12 to the bit lines BL and $\overline{BL}$ in response to control signals from word line WL.

Coupled to volatile storage portion 12 is non-volatile storage portion 14. Non-volatile storage portion 14 includes SONOS cells 28–34 and select transistors 36 and 38. SONOS cells 28–34 are non-volatile storage elements which use a nitride floating gate. In response to a programming voltage ($V_{PAS}$) applied to a control line 40, SONOS cells 30 and 34 capture the logic state of volatile storage portion 12. This state is retained by SONOS cells 28–34 even if power is removed from memory cell 10. To recall the state, for example upon power up, a recall voltage ($V_{RCL}$) is applied to control line 42. This has the effect of restoring the stored state of memory cell 10 to the volatile storage portion 12. Non-volatile storage portion 14 is coupled into and/or out of memory cell 10 in response to a select voltage ($V_{SE}$) applied to control line 44.

NVSRAM cell 10 is very large (in terms of die area) as compared to a conventional SRAM cell (e.g., a conventional 6T cell). In particular, six additional elements, SONOS cells 28–34 and pass gates 36 and 38, as well as three additional control lines, 40–44, are added to a conventional SRAM cell. Further, SONOS cells 28–34 require specifically timed signals to properly store and recall the state of memory cell 10. Thus, in addition to requiring complex pulses on control lines 40–44 for non-volatile operation, such a cell requires increased die area and, for a given size die, will reduce the density of available storage cells. It would be desirable to have a non-volatile SRAM cell which does not require the significantly increased die area and/or control pulses of such cells of the past.

SUMMARY OF THE INVENTION

In one embodiment the present invention provides a memory cell which combines non-volatile and volatile storage elements and which is configured to dynamically alter a threshold voltage of a non-volatile storage element to store a state of a volatile storage element. The non-volatile storage element may be a stacked gate PMOS transistor, and may include a gate structure having a poly-silicon control gate disposed over a poly-silicon floating gate. The control gate and floating gate may be separated by a coupling dielectric, which may be an ONO stack or a deposited oxide. The gate structure may be disposed over an active area of a substrate including a drain and a source of the PMOS transistor. The active area may be disposed in an n-well of the substrate. The volatile storage element may comprise an NMOS transistor which is formed in a p-well of the substrate. The p-well may further be disposed in an n-well. In alternative embodiments the volatile and non-volatile storage elements could be formed on an n-type substrate.

In a further embodiment, the present invention provides a memory cell having non-volatile storage elements configured to power up so that a first of the non-volatile storage element undergoes band-to-band tunneling induced hot electron injection onto its floating gate while a second of the non-volatile storage elements may undergo Fowler-Nordheim tunneling of electrons off its floating gate. For embodiments where the memory cell is a "one-time programmable" cell, the capability to undergo Fowler-Nordheim tunneling is not required, thus the non-volatile storage elements of such cells need not include a tunnel oxide. The memory cell may also include volatile storage elements and/or select transistors coupled to the non-volatile storage elements.

In yet a further embodiment, the present invention provides a memory or other integrated circuit including any of the above memory cells.

BRIEF DESCRIPTION OF THE DRAWINGS

The present invention is illustrated by way of example and not limitation in the figures of the accompanying drawings in which.

DETAILED DESCRIPTION

Figure 1:
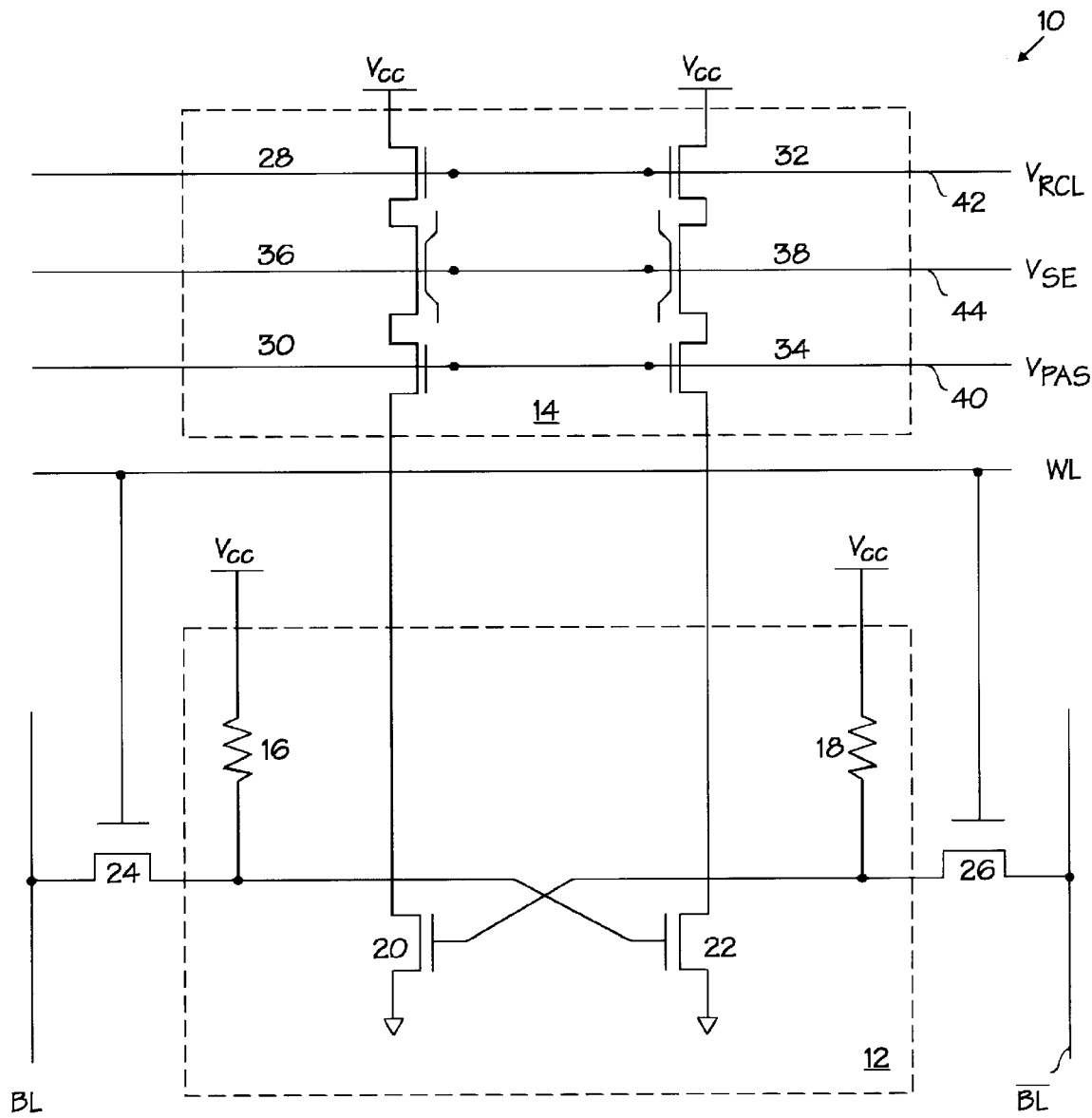
FIG. 1 illustrates a non-volatile SRAM cell using SONOS cells.

Described herein is a non-volatile random access memory (RAM). In one embodiment the present invention provides a memory cell which combines non-volatile and volatile storage elements and which is configured to dynamically alter threshold voltages of the non-volatile storage elements to store states of the volatile storage elements. The volatile storage elements may be stacked gate PMOS transistors, one of which may include a gate structure having a poly-silicon control gate disposed over a poly-silicon floating gate. The control gate and floating gate may be separated by a coupling dielectric, which may be an ONO stack or a deposited oxide. The gate structure may be disposed over an active area of a substrate including a drain and a source of the PMOS transistor. The active area may be disposed in an n-well of the substrate. A first of the volatile storage elements may comprise an NMOS transistor which is formed in a p-well of the substrate. The p-well may further be disposed in an n-well. In other embodiments, the non-volatile and volatile storage elements may be formed on an n-type substrate.

In an alternative embodiment, the memory cell may be configured as a "one-time programmable" cell. That is, the memory cell may be constructed so that the non-volatile storage elements are programmed to power up in a preferred state, for example a state corresponding to a "boot-up program" to be read from a memory device (or other programmable device) which includes the memory cell. In such an embodiment, the non-volatile storage elements do not require a tunnel oxide. In operation, the memory cell would power up with the non-volatile storage elements in their preferred state, thus "programming" the memory cell. The volatile storage elements could be written to and/or read from when the cell is energized, however, the state of the volatile storage elements would not be saved when power is removed (because the non-volatile storage elements are configured to always power up in their preferred state). Hereafter, the discussion is primarily directed to a memory cell wherein the non-volatile storage elements are used to store the state of the volatile storage elements if power is removed from the cell, however, it should be appreciated that the one-time programmable cell is also contemplated as being within the scope of the present invention.

In a further embodiment, the present invention provides a memory cell having non-volatile storage elements configured to power up so that a first of the non-volatile storage elements undergoes band-to-band tunneling induced hot electron (BBHE) injection onto its floating gate while a second of the non-volatile storage elements undergoes Fowler-Nordheim (F-N) tunneling of electrons off its floating gate. The memory cell may also include volatile storage elements and/or select transistors coupled to the non-volatile storage elements.

In yet a further embodiment the present invention provides a memory or other integrated circuit including any of the above memory cells.

Figure 2:
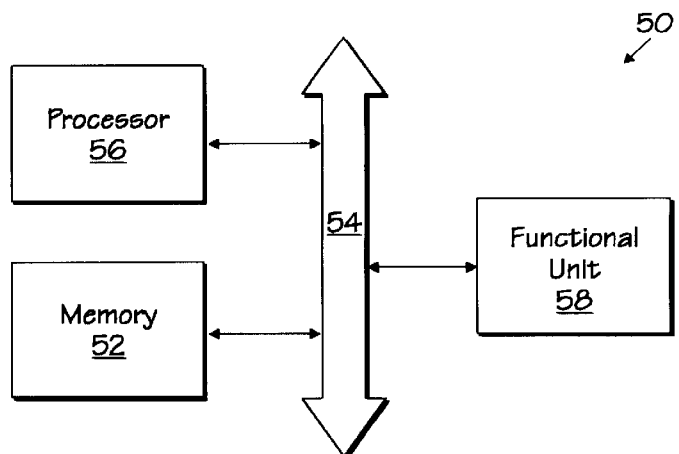
FIG. 2 illustrates a computer system including a memory configured according to one embodiment of the present invention.

FIG. 2 illustrates a computer system 50 which includes a memory 52 configured in accordance with an embodiment of the present invention. Memory 52 is coupled to a bus 54 which provides a communication path between memory 52 and a processor 56. In general, processor 56 uses memory 52 as a store of data and/or instructions. Computer system 58 may further include one or more functional units 58 which are coupled to bus 54. The functional units 58 may serve a variety of purposes, for example these units may be input/output (I/O) devices which transfer information (e.g., data and/or control signals) to/from processor 56 and/or memory 52. Further, functional unit(s) 58 may be (a) bus bridge(s) which provides a communication path between bus 54 and another bus (not shown), e.g., a system bus, within computer system 50. In such a configuration, bus 54 may serve as a local or processor bus.

Although the remaining discussion will generally assume that it is memory 52 which is configured as a non-volatile random access memory according to the present invention it should be recognized that processor 56 may include an onboard cache memory (not shown). Such a cache memory operates as a local storage system for processor 56 and is generally configured to provide rapid read and/or write capability. The present invention finds equal applicability for use in such a cache memory (or, further, for an external or L2 cache memory which may be coupled between processor 56 and bus 54). Accordingly, any references to the configuration and/or operation of memory 52 should be understood as being equally applicable to an onboard (or L1) cache within processor 56 and/or an external (or L2) cache. Note that in some processors, L1 and L2 caches may be contained on a single integrated circuit or the L2 cache may comprise a separate chip within a single package containing the L2 cache and a processor core. Further, the L1 cache may be implemented as separate instruction and data caches. All of these configurations are contemplated by the present invention, however, the present invention is not restricted to only L1 and L2 cache memories.

Figure 3:
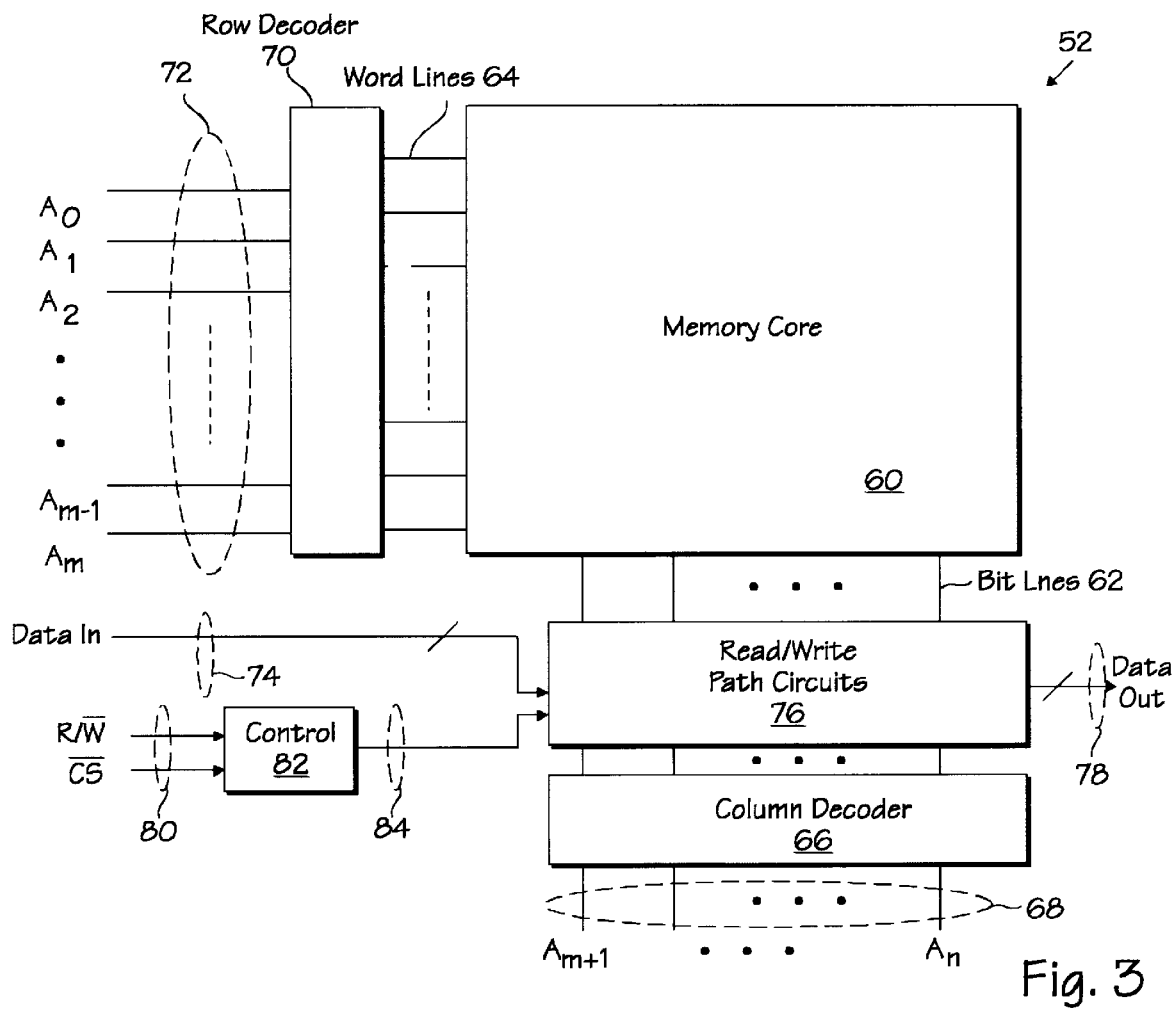
FIG. 3 further illustrates a memory configured in accordance with the present invention.

FIG. 3 illustrates memory 52 in more detail. Memory 52 generally includes a memory core 60 which is made up of a number of memory cells, one or more of which may be configured as non-volatile random access cells in accordance with the present invention. The cells of memory core 60 are accessed during read or write operations using bitlines 62 and wordlines 64. The bitlines 62 are selected using a column decoder 66 which receives and decodes address information from a plurality of address lines 68. Similarly, word lines 64 are selected by row decoder 70 in response to address information on address lines 72. Address lines 68 and 72 may be part of bus 54.

During a memory write operation, data presented on Data In bus 74 may be applied to selected bitlines 62 through write path circuitry 76. (In general, portions of the write path circuitry may be shared by portions of the read path circuitry and, thus, the two are shown as a single block 76.) Individual cells of a column (associated with the selected bitlines) within memory core 60 are selected by appropriate wordlines 64 and the data from the Data In bus 74 is stored in one or more of the memory cells. During a memory read, data is read out of selected memory cells through read path circuitry 76 to a Data Out bus 78. Data In bus 74 and Data Out bus 78 may be the same bus (at least in part) and is/are coupled to bus 54. Read and write operations are controlled using one or more control signals 80 (from bus 54) which are decoded and/or buffered using control circuitry 82 to provide appropriate internal control signals 84 to the read/write path circuits 76.

Figure 4:
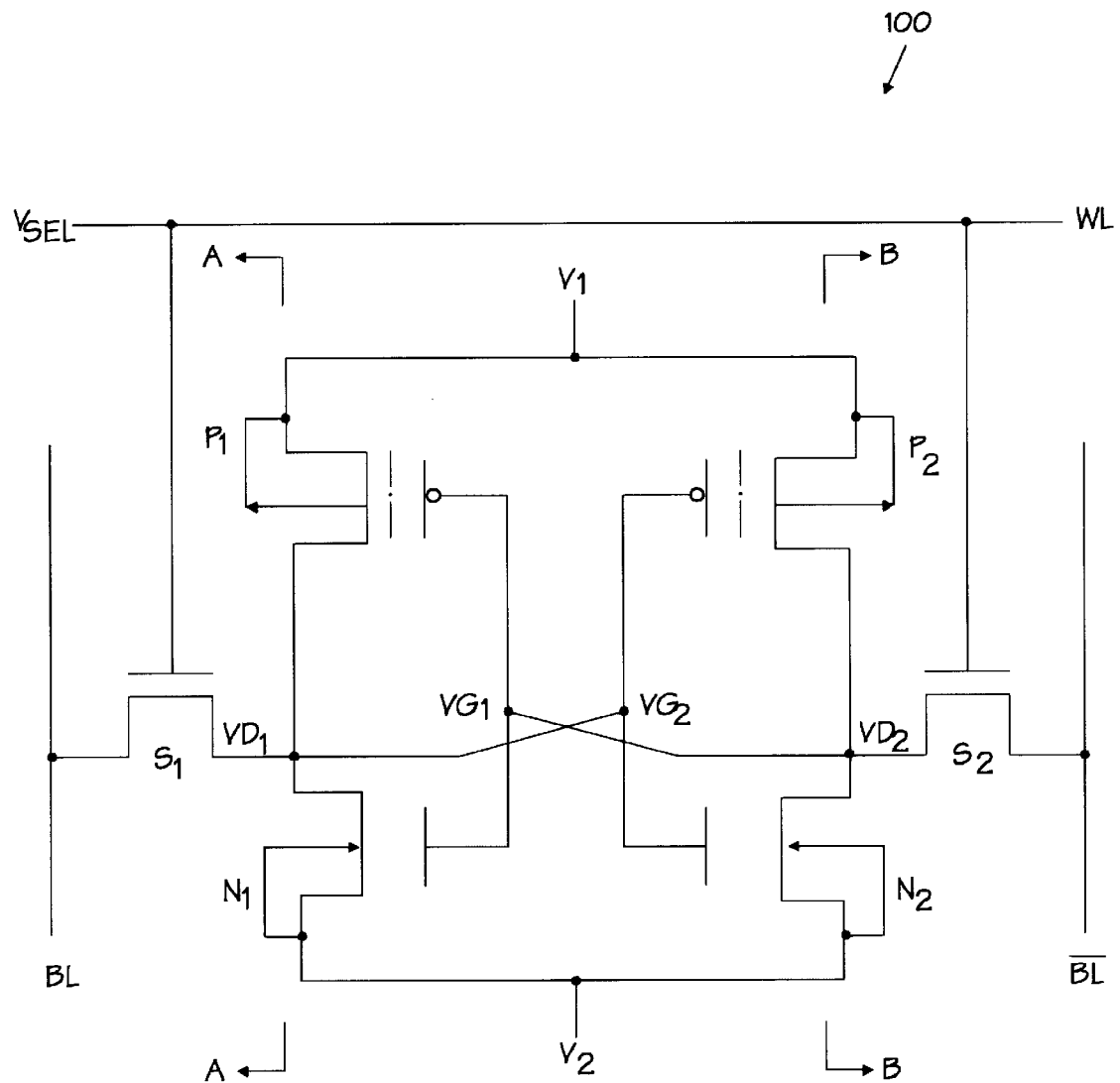
FIG. 4 illustrates a non-volatile SRAM cell configured according to one embodiment of the present invention.

FIG. 4 illustrates a memory cell 100 configured in accordance with the present invention. Memory cell 100 may be found within memory core 60 of memory 52 and/or may be a memory cell of a cache memory located onboard and/or external to processor 56. Alternatively, memory cell 100 may be part of a random access memory or serial memory employed in other applications, such as communication systems, computer peripherals, etc. Memory cell 100 resembles (at least in terms of gross structure) a conventional 6-transistor (6T) SRAM cell but provides at least the following advantages over NVSRAMs of the past. First, memory cell 100 is, in contrast with the large NVSRAM cell 10 shown in FIG. 1, approximately equal in size to a conventional 6T SRAM cell since the number of transistor elements is the same in both cases. Second, non-volatile (NV) storage and recall operations are launched by merely changing the supply voltage (Vcc-Vss) across terminals $V_1$ and $V_2$ to a programming voltage and do not require additional control lines for each cell 100. The NV storage and recall operations are performed by band-to-band tunneling induced hot electron (BBHE) injection and, alternatively, uniform Fowler-Nordheim (F-N) tunneling, both of which are very efficient compared to traditional channel hot electron (CHE) injection methods used in a majority of NVRAMs.

Memory cell 100 includes four conventional NMOS transistors: $N_1$ and $N_2$ for pull-down and $S_1$ and $S_2$ for selecting or transferring data between the cell 100 and the bit lines BL and $\overline{BL}$. PMOS pull-up transistors $P_1$ and $P_2$ are stacked gate, double-poly transistors with a bottom tunnel dielectric, poly-silicon floating gate and a top poly-silicon control gate. The control gates and floating gates are isolated by a thin poly-to-poly coupling dielectric which may be an ONO stack or a deposited oxide, e.g., deposited at high temperature. The simplest tunnel dielectric is a thermally grown or a deposited oxide. Note that for the one-time programmable cell described above, the non-volatile cells need not be configured to provide the F-N tunneling capability, i.e., no tunnel oxide is required.

Figure 5:
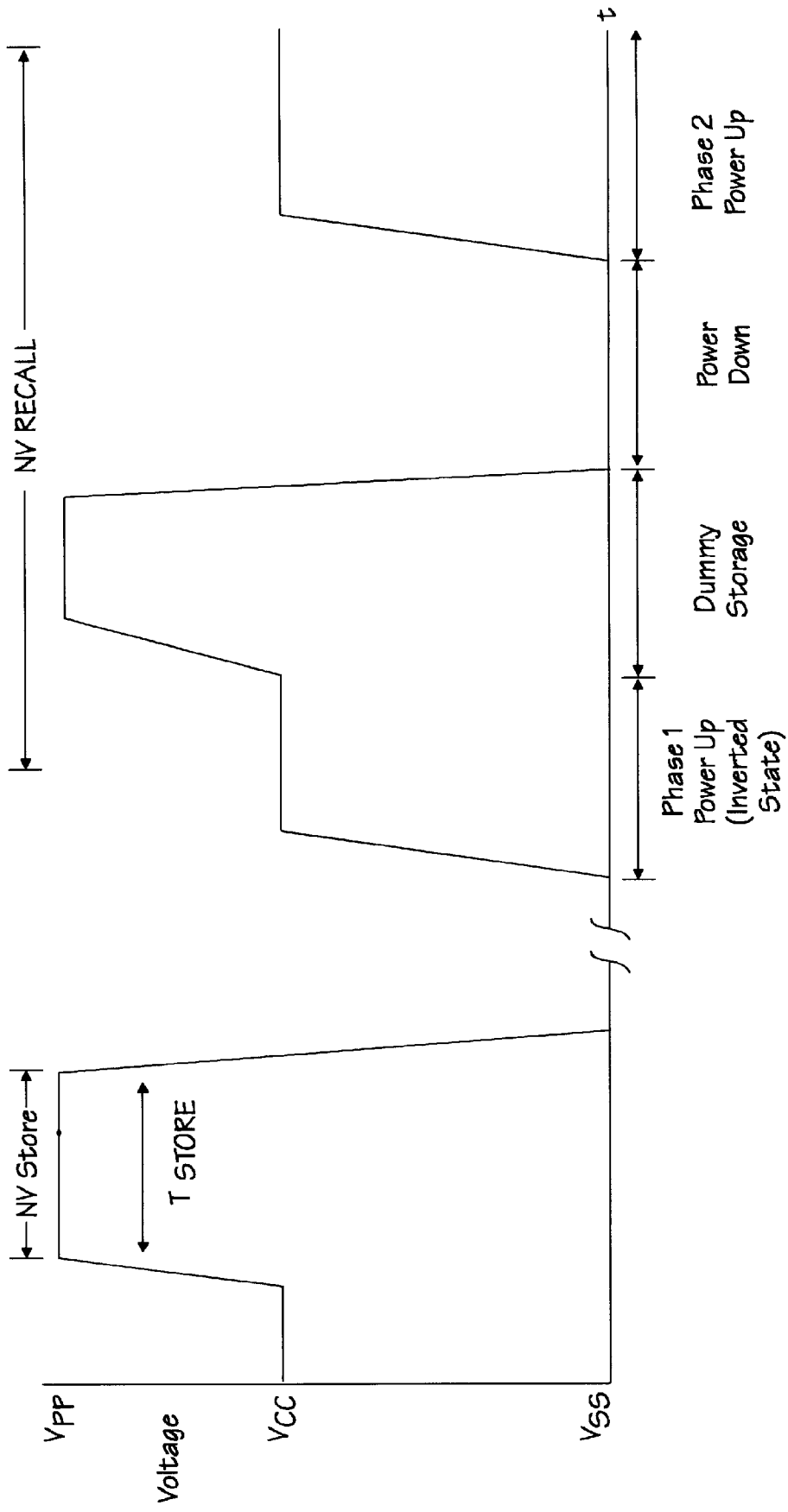
FIG. 5 illustrates a storage and recall cycle for a non-volatile SRAM cell according to an embodiment of the present invention.

The operation of memory cell 100 is briefly described as follows. With a normal supply voltage (Vcc-Vss) across terminals $V_1$–$V_2$, memory cell 100 functions exactly like a conventional SRAM cell with unlimited, fast read/write operations. An NV storage operation is shown in FIG. 5 and is enabled by boosting the supply voltage (Vcc-Vss) to higher or programming voltage (Vpp-Vnn) approximately 2 (Vcc -Vss), such that $E_{ox}$, the field across the tunnel oxide, $\geq 8$ MV/cm for a specified time ($T_{STORE}$) of the order of 1–10 msec. Note that Vnn may be equal to Vss. During this time ($T_{STORE}$), electrons are injected by BBHE into the floating gate of the non-conducting stacked gate PMOS transistor while electrons tend to be removed by F-N tunneling from the floating gate of the conducting stacked gate PMOS transistor. Thus, charge is stored on the floating gate of the PMOS transistor undergoing BBHE while charge is removed from the floating gate of the CMOS transistor undergoing F-N tunneling. These details are explained further below.

At the end of a storage operation, there is an imbalance in the threshold voltages ($V_T$s) of the stacked gate PMOS transistors $P_1$ and $P_2$. The $V_T$ of the "OFF" (i.e., non-conducting) PMOS transistor becomes more positive due to BBHE injection while the $V_T$ of the "ON" (i.e., conducting) PMOS transistor tends to become negative due to F-N tunneling current. After the storage operation, Vcc can be removed indefinitely. During this power down time, the difference in the PMOS $V_T$s will be preserved.

Two features of this storage operation are:

1. The imbalance created in the $V_T$s of the PMOS transistors are opposite to their current conducting states, i.e., the $V_T$ of the non-conducting PMOS transistor is shifted towards the conducting state and vice-versa.

2. This kind of imbalance may be created for all the NV cells 100 in the entire memory core 60 during the storage operation.

As further shown in FIG. 5, an NV recall operation may be performed in two stages. On power up (Phase 1), the PMOS transistor with a less negative $V_T$ becomes conducting or "ON". This was the "OFF" PMOS transistor during the NV storage operation. Thus, on initial power up, the recalled state of cell 100 is the inverse of the cell state during the NV storage operation. To retrieve the original state of cell 100, one more NV storage operation (a "dummy" storage operation) is performed by raising Vcc to Vpp (and lowering Vss to Vnn if desired). This is followed by a power down period (Vcc is removed) and a second power up (Phase 2) during which the supply voltage to the cell 100 raised from 0 to Vcc. Due to the inversion of states during the dummy storage and recall (Phase 2 power up) operations, the state recalled after the Phase 2 power up is the same as the original state when the first storage operation was performed. Thus, the originally stored state of cell 100 is recovered.

Table 1 describes these modes of operation and assumes that cell 100 is initialized so that VD1=Vss (i.e., BL=Vss) and VD2=Vcc (i.e., $\overline{BL}$=Vcc). Select transistor S1 and S2 are off after the initial write during the NV storage operation when Vcc is raised to Vpp. Also the voltage at V2 can be pulled down to Vnn<Vss if the NMOS transistors N1 and N2 are in a p-well in an n-well (triple well) scheme.

TABLE 1

Modes of Operation

| Operation | Supply Voltage | N1 State | N2 State | P1 State | P2 State | $VD_1 = VG_2$ | $VD_2 = VG_1$ | $V_TP_1:V_TP_2$ |
|---|---|---|---|---|---|---|---|---|
| Initial State (after SRAM Write) | Vcc | ON | OFF | OFF | ON | Vss | Vcc | $V_TP_1 = V_TP_2$ |
| NV Store | Vpp | ON | OFF | OFF | ON | Vss | Vpp | $V_TP_1 > V_TP_2$ |
| NVRecall Sequence | | | | | | | | |
| Phase 1 Power-Up | Vcc | OFF | ON | ON | OFF | Vcc | Vss | $V_TP_1 > V_TP_2$ |
| NV Dummy Store | Vpp | OFF | ON | ON | OFF | Vpp | Vss | $V_TP_1 < V_TP_2$ |
| Phase 2 Power-Up | Vcc | ON | OFF | OFF | ON | Vss | Vcc | $V_TP_1 < V_TP_2$ |

To summarize then, during NV storage and/or recall operations, the threshold voltages of transistors P1 and $P_2$ of memory cell 100 are selectively imbalanced by pulsing a supply voltage for cell 100 from an operating voltage level (e.g., Vcc) to a programming voltage level (e.g., Vpp). As further discussed below, the pulsing operation may include raising the supply voltage from the operating voltage level to the programming voltage level for a predetermined period of time (e.g., $T_{STOR}$) sufficient to store the state of memory cell 100. Alternatively, the pulsing operation may include repeatedly toggling the supply voltage between the operating voltage level and the programming voltage level for predetermined time intervals until the state of the memory cell is stored. The programming voltage level may be approximately twice the operating voltage level.

For the one-time programmable cell, the PMOS transistors are configured to power up in a preferred state. that is, one of the PMOS transistors is configured to conduct at power up, while the other PMOS transistor is configured to be non-conducting at power up. Accordingly, the cell will be configured to have a power up state whch replaces the recalled state of the cell discussed above. That is, on power up, the one-time programmable cell will always reflect the preferred (e.g., preprogrammed) state (e.g., as may be useful for recalling a boot-up program or other power up configuration), and no dummy storage operations will be required to preserve this state.

Figure 6:
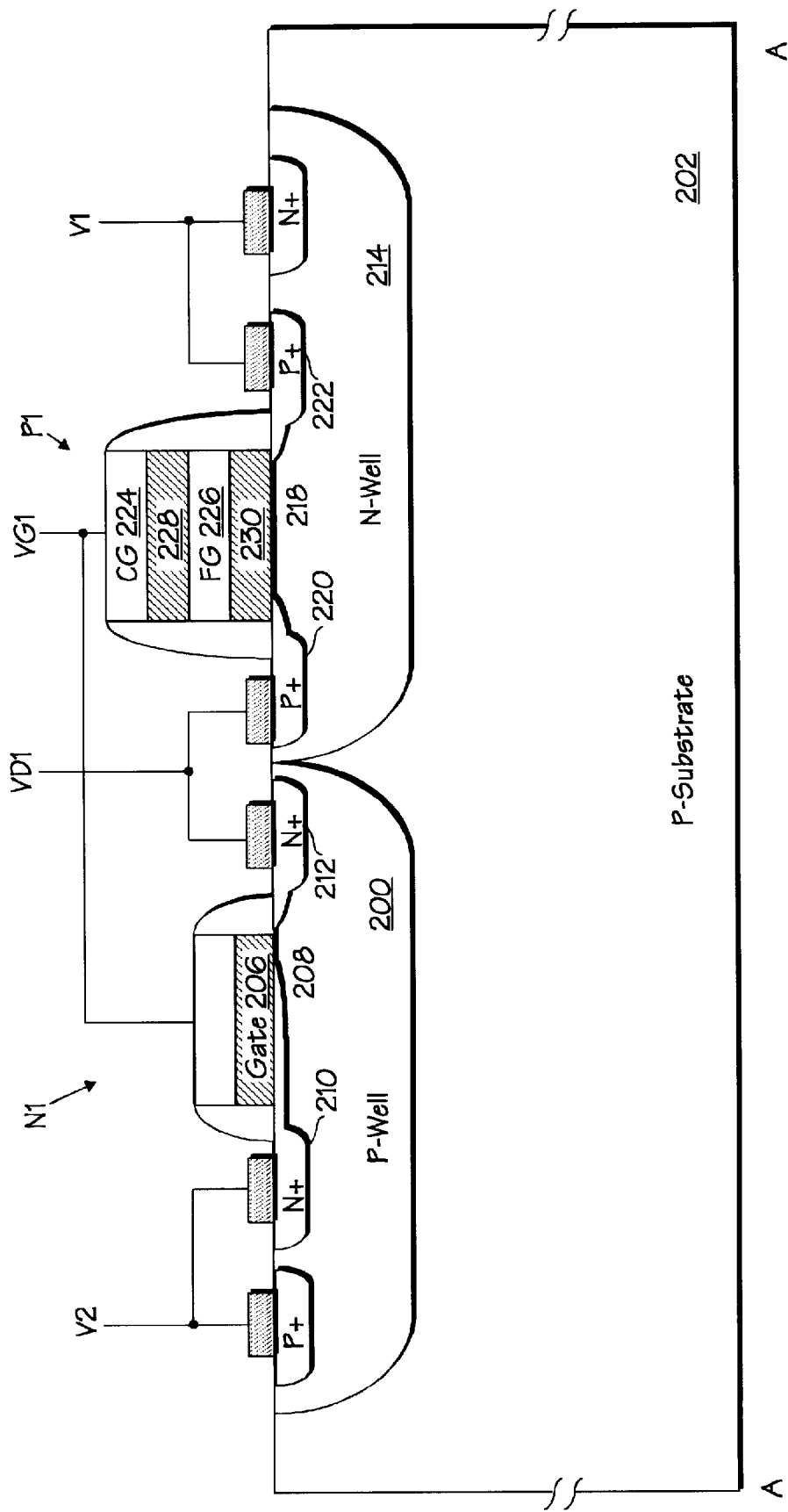
FIG. 6 is a cross-sectional view of a transistor pair for a non-volatile SRAM according to an embodiment of the present invention.

FIG. 6 is a cross-section along line A—A of FIG. 4 and further illustrates transistors $N_1$ and $P_1$. As shown, transistor $N_1$ may be formed in a p-well 200 in a p-type substrate 202. Transistor $N_1$ includes a gate structure 206 disposed over an active region 208 having a source 210 and a drain 212. Stacked gate transistor $P_1$ may be formed in an n-well 214 disposed within p-substrate 202 and includes gate structure 216 disposed over active region 218. Active region 218 includes drain 220 and source 222. The gate structure 216 is made up of control gate 224 disposed over floating gate 226. As indicated above, floating gate 226 and control gate 224 may be poly-silicon structures. The control gate 224 and floating gate 226 are isolated by a thin poly-to-poly coupling dielectric 228 which may be an ONO stack or a deposited oxide, deposited and/or annealed at high temperature (e.g., approximately 700° C.). Below floating gate 226 is a tunnel dielectric 230 which may be a thermally grown or a deposited oxide. In other embodiments, the volatile and non-volatile storage elements may be formed on an n-type substrate using conventional CMOS processing techniques.

Figure 7:
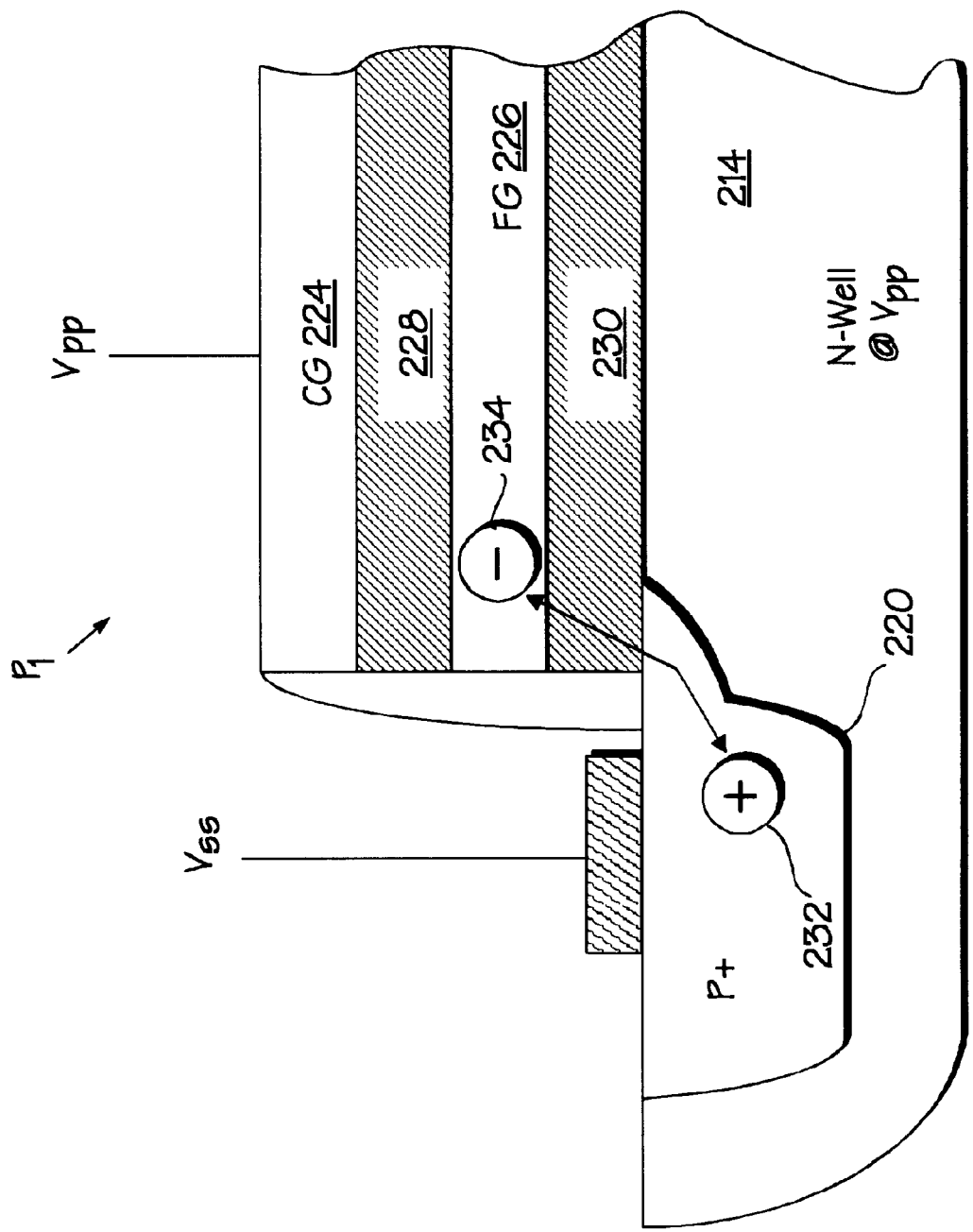
FIG. 7 is an exploded view of a stacked gate transistor for use according to one embodiment of the present invention.

FIG. 7 is an exploded view of transistor $P_1$ under the NV storage conditions set forth in Table 1 with Vpp applied to terminal $V_1$ and Vnn=Vss applied to terminal $V_2$. The figure shows the band-to-band tunneling induced hot electron (BBHE) injection which occurs under these conditions. Holes 232 drift towards Vss and are pushed away from tunnel oxide 230 due to a positive Vpp voltage applied to the control gate 224 which couples to floating gate 226. The same positive bias attracts a large fraction of BBHE current ($\approx 10^{-2}$) compared to electrons 234 going to the n-well 214. Thus, the NV storage operation which selectively imbalances the threshold voltages of the PMOS transistors $P_1$ and $P_2$ of memory cell 100 includes creating an electric field within transistor P1 to inject hot electrons onto floating gate 226.

For an NVSRAM cell, a control gate 224 to floating gate 226 coupling ratio (KG)$\geq$0.7 can be achieved and during the NV storage operation the floating gate 226 will be at a high positive potential with respect to the drain 220. Thus, the drain to n-well junction sees a reverse-bias of Vpp. The drain junction and floating gate potentials cause an appreciable band-to-band tunneling current ($\approx$10–100 nA) to flow from the n-well 214 to the $p^+$ drain 220. The holes 232 are swept to the $p^+$ drain 220 biased at Vss. Some of the band-to-band tunneling induced hot electrons are injected through the tunnel dielectric 230 to the floating gate 226 while the rest of the BBHE are collected by the n-well 214 at +Vpp.

The BBHE injection mechanism has some key advantages compared to other methods such as conventional hot electron (CHE) injection and F-N tunneling. For example:

1. The high positive bias on the floating gate 226 and zero bias at the drain 220 sets up a high electric field $E_{ox}$ across the tunnel oxide 230. This aiding field injects hot electrons with a high injection efficiency$\approx 10^{-2}$ compared to $10^{-4}$ to $10^{-5}$ for pchannel or n-channel hot electron injection and $10^{-3}$ to $10^{-4}$ for F-N tunneling. The drain current can be quite low, e.g., of the order of <100 nA per cell.

2. For the same injected gate current Ig, $E_{ox}$ for BBHE injection can be about 35% lower compared to F-N tunneling. For example, $E_{ox}$ may be of the order of 7–8 MV/cm versus 12 MV/cm for F-N tunneling. Thus, the requirement for Vpp is at least 30% lower for BBHE injection.

3. Due to BBHE injection, $V_T$ of p-channel transistor P1 ($V_TP_1$) becomes more positive, pushing $P_1$ more towards the conducting state. At the end of the storage phase, $V_T$ of $P_1$ lies in the range $V_TP$<VTP1<0 where $V_TP$ and $V_TP_1$ are negative. As explained later, monitoring of leakage current Ipp from Vpp, or alternatively the leakage current through transistor $P_1$ at Vcc, allows the time of the storage phase ($T_{STOR}$) to be selected such that $V_T$ of $P_1$ lies in the range $V_TP$<$V_T$P1<0 where $V_TP$ is the threshold voltage of a charge-neutral PMOS stacked gate transistor. It is desired to maintain $V_TP_1$ negative at the end of the storage operation so that the current leaking through $P_1$ and $N_1$ from Vcc to Vss is kept small.

4. Because $E_{ox}$ at the maximum electron injection point is relatively low ($E_{ox} \approx 7$ MV/cm compared to >12 MV/cm for other methods for the same Ig), the endurance of the cell using BBHE injection is higher than using CHE or F-N tunneling.

Figure 8:
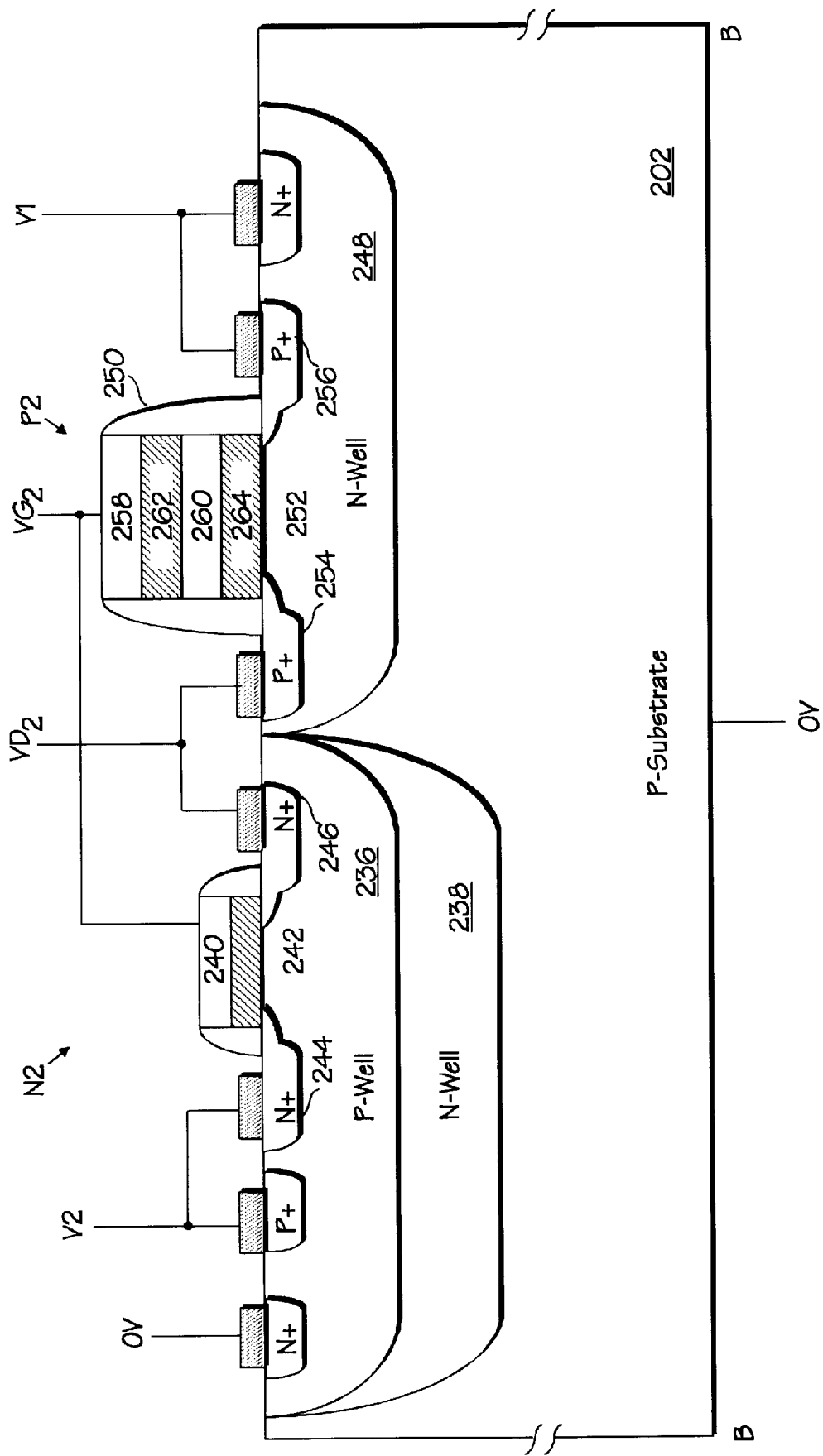
FIG. 8 is a cross-sectional view of another transistor pair of a non-volatile SRAM according to an embodiment of the present invention.

FIG. 8 illustrates a cross-section along line B—B in FIG. 4 in another embodiment of the present invention. The illustration is for a triple well scheme. The NMOS transistor $N_2$ is in a p-well 236 inside a deep n-well 238. This allows the voltage at terminal $V_2$ to be pulled down to a negative voltage Vnn when the voltage at terminal $V_1$ is raised to Vpp during NV storage and/or recall operations. Note that if n-well 238 were deleted, the scheme is the same as the one depicted in FIG. 6. Transistor $N_2$ includes a gate structure 240 disposed over an active region 242 having a source 244 and a drain 246. Stacked gate transistor $P_2$ may be formed in an n-well 248 disposed within psubstrate 202 and includes gate structure 250 disposed over active region 252. Active region 252 includes drain 254 and source 256. The gate structure 250 is made up of control gate 258 disposed over floating gate 260. As indicated above, floating gate 258 and control gate 260 may be poly-silicon structures. The control gate 258 and floating gate 260 are isolated by a thin poly-to-poly coupling dielectric 262 which may be an ONO stack or a deposited oxide, deposited at high temperature. Below floating gate 260 is a tunnel dielectric 264 which may be a thermally grown or a high temperature deposited oxide.

During the NV storage operation described in Table 1, the gate 250 of p-channel transistor P2 is at Vss. The channel is turned on and is at +Vpp. This will tend to discharge electrons from the floating gate 260, which is at low bias, by F-N tunneling to the channel at +Vpp. In other words, selectively imbalancing the threshold voltages of the PMOS transistors of cell 100 may include creating an electric field within transistor $P_2$ to tunnel electrons off floating gate 260. Preferably, this electric field is created simultaneously with the electric field created in transistor $P_1$ by applying the programming voltage to memory cell 100. The discharge current in transistor $P_2$ will be larger if the floating gate 260 of $P_2$ is charged with electrons.

Thus, at the end of an NV storage operation, $V_T P_2 = V_T P - \Delta V_T P_2$ $V_T P_1 = V_T P + \Delta V_T P_1$ and $V_T P_1 > V_T P_2$; $V_T P_1 - V_T P_2 \approx 0.1$ to 0.5 V Since $Vcc \leq Vpp/2$, $E_{ox}$ during normal operation would be less than half of $E_{ox}$ during storage operation. The band-to-band tunneling current and BBHE injection would therefore be negligible. The floating gate of a p-channel transistor where $V_T$ is more positive than $V_T P$ is negatively charged leading to a larger $E_{ox}$ across the tunnel oxide from the floating gate to the p+ source which is at +Vcc. This would tend to leak the electrons in the floating gate by F-N tunneling current. This kind of disturb by F-N tunneling currents from a negatively charged floating gate to the p+ source at +Vcc would tend to bring the $V_T$ of a p-channel transistor, initially $>V_T P$, to $V_T P$, the charge neutral $V_T$ of a PMOS transistor over a long period of time. During NV storage (actually standby) Vcc=0, Eox is small and there would be no such disturb because the F-N tunneling currents would be extremely small. Therefore the difference in the $V_T$s of $P_1$ and $P_2$ created during storage operation would be maintained during power off periods. With respect to the normal SRAM operation, it should be noted that the voltages coupled from the control gates of the PMOS transistors $P_1$ and $P_2$ would override the imbalances created during storage operations.

The highest $V_T P$ is still less than 0 V, i.e., it is negative. Therefore when the control gate voltage is equal to Vcc, the PMOS transistor would be off. Similarly, the change in $V_T P_2$ in the negative direction would be small. With the control gate voltage equal to Vss, the PMOS transistor would conduct.

Figure 9:
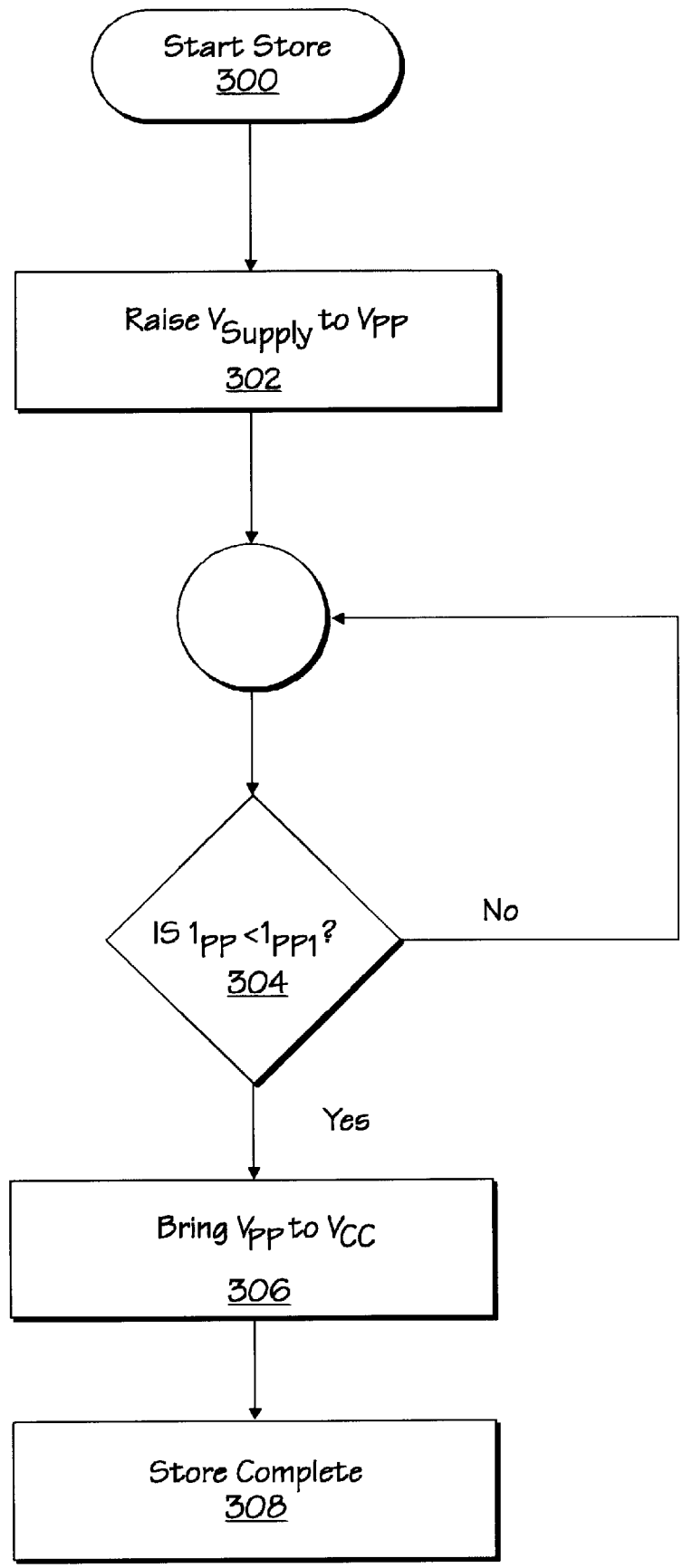
FIG. 9 is a flow diagram illustrating a storage operation in accordance with one embodiment of the present invention.

The NV storage operation discussed above is further illustrated in the flow diagram of FIG. 9. The NV storage operation begins at step 300 and at step 302 the supply voltage is raised from the operating voltage level (Vcc) to the programming voltage level (Vpp). By raising Vcc to Vpp, the $V_T$ of the "OFF" p-channel transistor ($P_1$ in Table 1) is made less negative due to BBHE injection. The VT of the "ON" p-channel transistor ($P_2$ in Table 1) is made more negative by F-N tunneling. This creates an imbalance in the PMOS $V_T$'s which is maintained when power is removed from the memory cell.

As shown at step 304, the supply voltage is kept at Vpp until Ipp<$Ipp_1$, where Ipp is the total band-to-band tunneling current drawn by the memory array from Vpp and Ipp1 is specified limit for Ipp. The band-to-band tunneling current has an exponential dependence on $E_{ox}$. As the floating gate is charged with BBHE injected electrons, $E_{ox}$ decreases, reducing the band-to-band tunneling current. Simultaneously, $V_T P_1$ of the p-channel transistor increases. Therefore, the increase in VT and decrease in band-to-band tunneling current can be directly related and a limit $I_{PP1}$ determined for a specified $V_T P_1$. Ipp may be monitored while the supply voltage is equal to Vpp until Ipp reaches a preset limit ($Ipp_1$) for array current leakage. This is a time period equivalent to $T_{STORE}$ shown in FIG. 5. After this condition is met, the storage process proceeds to step 306 where the supply voltage is lowered to Vcc (alternatively, power may be removed completely from the cell as shown in FIG. 5). This completes the storage operation (step 308). A recall operation may be performed as described with reference to FIG. 5 using a power up, dummy NV storage (following the steps of FIG. 9), power down and power up sequence to retrieve to the initial state of the cell before power was first turned off.

Figure 10A:
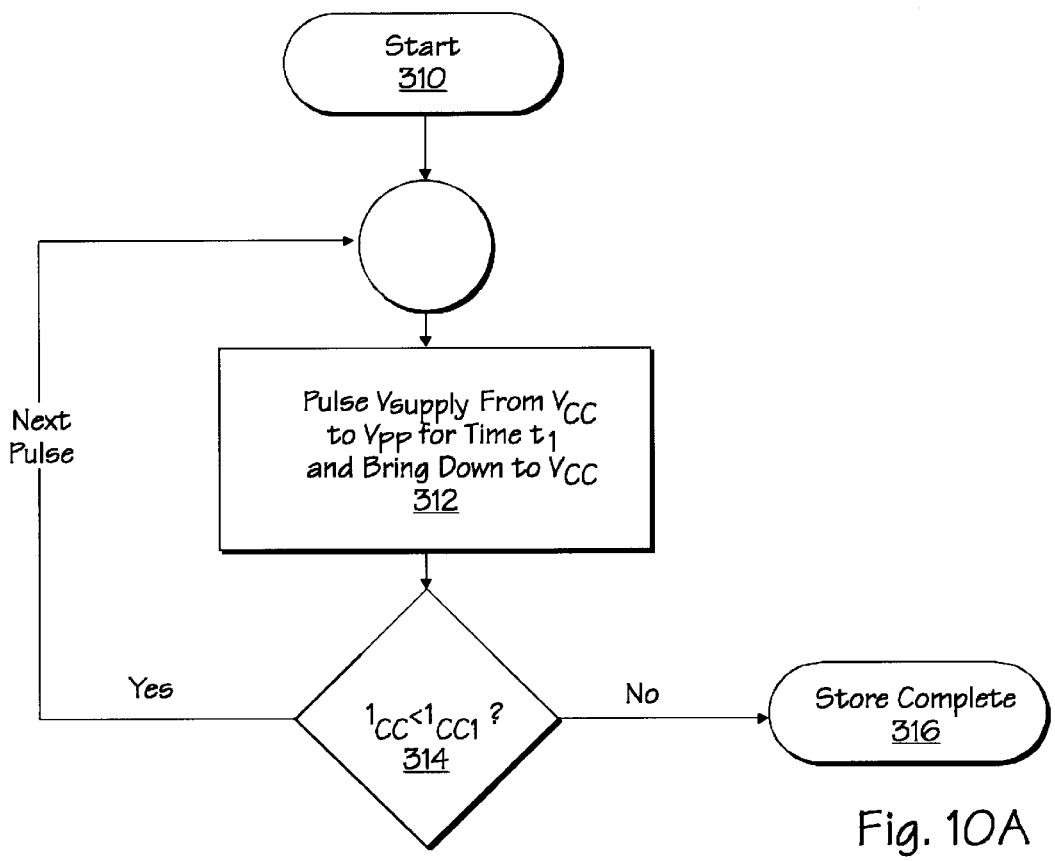
FIG. 10A is flow diagram illustrating a storage operation in accordance with yet another embodiment of the present invention.
Figure 10B:
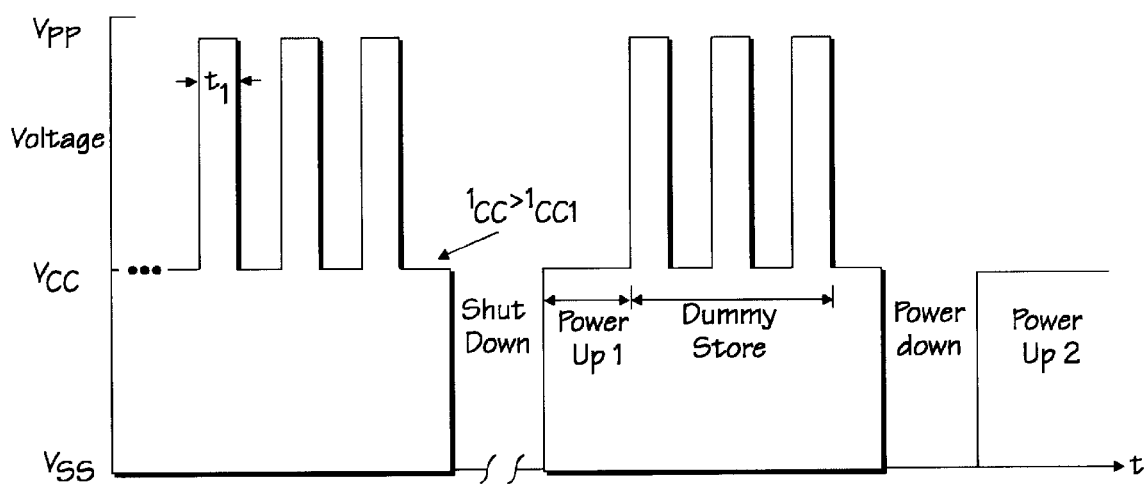
FIG. 10B illustrates a storage and recall operation in accordance with yet a further embodiment of the present invention.

An alternative NV storage and recall scheme is illustrated in FIGS. 10A and 10B. In this scheme, the threshold voltages of the PMOS transistors of the memory cell are again selectively imbalanced by pulsing a supply voltage for the memory cell from an operating voltage level to a programming voltage level. This time, however, the pulsing operation may include repeatedly toggling the supply voltage between the operating voltage level (Vcc) and the programming voltage level (Vpp) for predetermined time intervals ($t_1$) until the state of the memory cell is stored. The programming voltage level may be approximately twice the operating voltage level, or greater.

Figure 11:
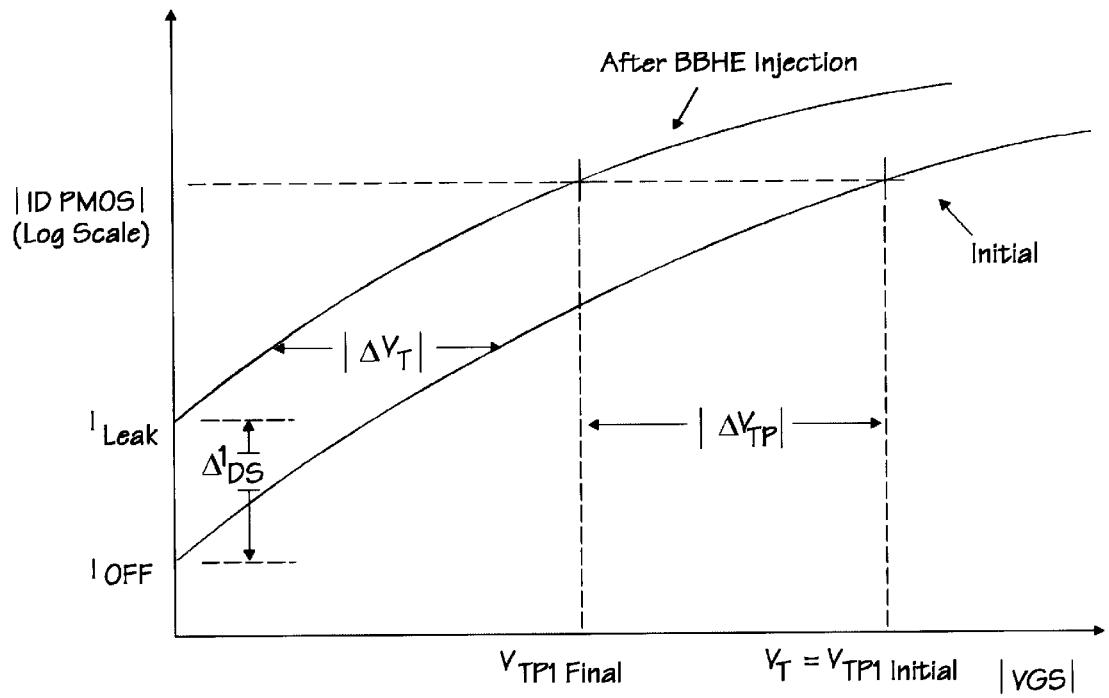
FIG. 11 illustrates the increase in subthreshold leakage current of a p-channel transistor when its threshold voltage is shifted towards conduction.

The storage operation begins at step 310 and at step 312 the supply voltage is pulsed from Vcc to Vpp for a time period $t_1$. A check is then made at step 314 to determine if Icc>$Icc_1$ where $Icc_1$ is the upper limit for the leakage of the memory array at Vcc and is less than Isb, the standby leakage current specified for the device. The aforementioned leakage of the memory array is due to the subthreshold leakage of a p-channel transistor which increases as its $V_T$ is increased due to BBHE injection into the floating gate. The initial and increased subthreshold currents are depicted in FIG. 11. $I_{CC1}$ is the sum of the subthreshold drain leakage for the array and can be directly related to the final $V_T P_1$.

If Icc is not >$Icc_1$, the pulsing operation of step 312 is repeated until this condition is met, at which time the storage operation is completed at step 316. FIG. 10B illustrates the storage operation graphically. Further the illustration shows that the NV recall operation may be performed in a similar fashion to the process shown in FIG. 5 with an initial power up followed by a dummy storage operation and second power up to retrieve the originally stored state of the memory cell. Note that the dummy storage operation may include repeatedly toggling the supply voltage between the operating voltage level (Vcc) and the programming voltage level (Vpp) for predetermined time intervals ($t_1$) using the scheme depicted in FIG. 10B until the state of the memory cell is stored, resulting in a controlled $V_T$ imbalance.

There is an important advantage to the NV recall sequence just described. With reference to Table 1 and FIG. 4, if during NV store operations electrons are injected into the floating gate of transistor $P_1$, during the NV dummy store of the NV recall sequence electrons tend to be discharged by F-N tunneling. Instead BBHE injection occurs into the floating gate of transistor $P_2$. Thus, one-half of the floating gates see charging and discharging of electrons (or discharging and charging for the other floating gate) for each store and recall operation. This prevents continuous charging of a floating gate of a storage element, regardless of the state of the memory cell being stored in each successive store operation. Thus, even if the same memory cell state (e.g., a "1" or a "0") is being stored in each successive store operation, the $\Delta V_T$s ($V_T$ imbalance) of the p-channel storage transistors are switched to the opposite polarity during the dummy store operation in the NV recall cycle. The NV recall dummy storage tends to reset the $V_T$ shift which occurs during a store and prevents the $V_T$ of a storage element from being shifted continuously in one direction due to repetitive storage of the same memory cell state.

Thus, a non-volatile random access memory has been described. Although the foregoing description was set forth with reference to certain illustrated embodiments, it should be appreciated that the present invention is in no way limited to these examples and that the invention should only be measured in terms of the claims which follow.

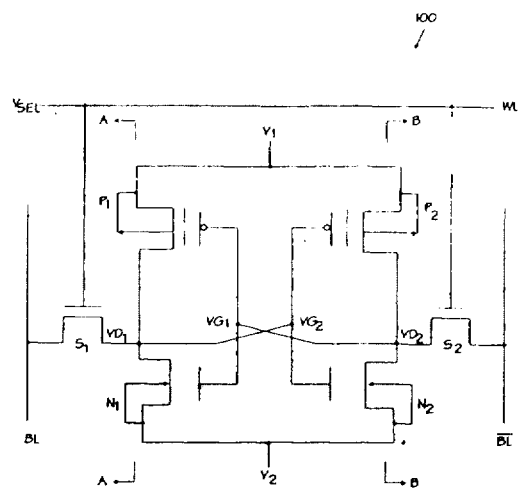

What is claimed is:

1. A memory cell comprising a stacked gate PMOS transistor configured as a non-volatile storage element and having a gate structure, including a floating gate, overlapping an active area of a substrate including a drain and a source and an NMOS transistor configured as a volatile storage element, said memory cell being configured to dynamically alter a threshold voltage of said non-volatile storage element to store a state of said volatile storage element.

2. The memory cell as in claim 1 wherein said active area of said substrate is formed in an n-well of a p-type substrate.

3. The memory cell as in claim 2 wherein said NMOS transistor is formed in a p-well of said p-type substrate.

4. The memory cell as in claim 3 wherein said p-well is disposed in a further n-well of said p-type substrate.

5. The memory cell as in claim 2 further comprising a select transistor coupled to said stacked gate PMOS transistor and said NMOS transistor and configured to provide access to said memory cell.

6. A memory comprising a plurality of memory cells of claim 1.

7. A computer system comprising the memory of claim 6.

8. An integrated circuit comprising the memory cell of claim 1.

9. The memory cell as in claim 5 wherein said gate structure of said stacked gate PMOS transistor further comprises a tunnel dielectric layer between said floating gate and said active area.

10. The memory cell as in claim 9 wherein said dielectric is an oxide layer.

11. The memory cell as in claim 9 wherein said dielectric comprises an ONO stack.

12. The memory cell as in claim 1 wherein said gate structure of said stacked gate PMOS transistor further comprises a control gate disposed over said floating gate and being separated from said floating gate by a dielectric.

13. The memory cell as in claim 12 wherein said control gate and said floating gate comprise poly-silicon structures.

14. A memory cell having a first non-volatile storage element configured to power up such that said first non-volatile storage element undergoes band-to-band tunneling induced hot electron injection to store charge on a floating gate of said first non-volatile storage element.

15. The memory cell in claim 14 further comprising a second non-volatile storage element configured to power up such that said second non-volatile storage element undergoes Fowler-Nordheim tunneling of electrons from a floating gate of said second non-volatile storage element to remove charge from gate of said second non-volatile storage element.

16. The memory cell in claim 14 further comprising volatile storage elements coupled to one another and to said non-volatile storage elements.

17. The memory cell in claim 16 further comprising select transistors coupled between respective pairs of said volatile and non-volatile storage elements and a select line.

18. A memory comprising the memory cell of claim 17 wherein said select line comprises a wordline.

19. A computer system comprising the memory of claim 18.

20. An integrated circuit comprising the memory cell of claim 14.

* * * * *

UNITED STATES PATENT AND TRADEMARK OFFICE
CERTIFICATE OF CORRECTION

PATENT NO. : 5,914,895  
DATED : June 22, 1999  
INVENTOR(S) : Fredrick B. Jenne Page 1 of 2

It is certified that error appears in the above-identified patent and that said Letters Patent is hereby corrected as shown below:

The title page, showing the illustrative figure, should be deleted and substitute therefor the attached title page.

Signed and Sealed this

Twenty-eighth Day of December, 1999

Attest:

Q. TODD DICKINSON

Attesting Officer

Acting Commissioner of Patents and Trademarks

United States Patent [19]

Jenne

[11] Patent Number: 5,914,895
[45] Date of Patent: Jun. 22, 1999

[54] NON-VOLATILE RANDOM ACCESS MEMORY AND METHODS FOR MAKING AND CONFIGURING SAME

[75] Inventor: Fredrick B. Jenne, Los Gatos, Calif.

[73] Assignee: Cypress Semiconductor Corp., San Jose, Calif.

[21] Appl. No.: 08/926,611

[22] Filed: Sep. 10, 1997

[51] Int. Cl.$^6$ ................................................. G11C 14/00
[52] U.S. Cl. .............................. 365/185.08; 365/185.28; 365/185.26; 365/208; 365/184; 365/185.05
[58] Field of Search ............................. 365/156, 154, 365/185.08, 185.01, 185.26, 185.28, 208, 212, 184, 185.05

[56] References Cited

U.S. PATENT DOCUMENTS

| | | | |
|---|---|---|---|
| H1414 | 2/1995 | Borgen | 380/4 |
| 4,095,281 | 6/1978 | Denes | 365/156 |
| 4,342,101 | 7/1982 | Edwards | 365/154 |
| 4,354,255 | 10/1982 | Stewart | 365/154 |
| 4,435,786 | 3/1984 | Tickle | 365/154 |
| 4,510,584 | 4/1985 | Dias et al. | 365/203 |
| 4,538,246 | 8/1985 | Wang et al. | 365/226 |
| 4,638,465 | 1/1987 | Rosini et al. | 365/228 |
| 5,353,248 | 10/1994 | Gupta | 365/154 |
| 5,365,475 | 11/1994 | Matsumura et al. | 365/154 |
| 5,523,971 | 6/1996 | Rao | 365/185.07 |
| 5,648,930 | 7/1997 | Randazzo | 365/185.07 |
| 5,677,866 | 10/1997 | Kinoshita | 365/156 |
| 5,774,397 | 6/1998 | Endoh et al. | 365/185.19 |

OTHER PUBLICATIONS

Christian E. Herdt et al., "A 256K Nonvolative Static RAM", *Simtek Corporation*, No. 5.3, pp. 1–4 (1995).
T. Ohnakado et al., "Novel Electron Injection Method Using Band-to-Band Tunneling Induced Hot Electron (BBHE) for Flash Memory with a P-Channel Cell", *IEDM* 95-279, pp. 11.5.1–11.5.4 (1995).

*Primary Examiner*—David Nelms
*Assistant Examiner*—Thong Le
*Attorney, Agent, or Firm*—Blakely Sokoloff Taylor & Zafman LLP

[57] ABSTRACT

A memory cell includes non-volatile and volatile storage elements and is configured to dynamically alter threshold voltages of the non-volatile storage elements to store states of the volatile storage elements. The volatile storage elements may be stacked gate PMOS transistors, one of which may include a gate structure having a poly-silicon control gate disposed over a poly-silicon floating gate. The control gate and floating gate may be separated by a coupling dielectric, which may be an ONO stack or a deposited oxide. The gate structure may be disposed over an active area of a substrate including a drain and a source of the PMOS transistor. The active area may be disposed in an n-well of the substrate. A first of the volatile storage elements may comprise an NMOS transistor which is formed in a p-well of the substrate. The p-well may further be disposed in an n-well. In a further embodiment, a memory cell includes non-volatile storage elements configured to power up so that a first of the non-volatile storage element undergoes band-to-band tunneling induced hot electron injection onto its floating gate while a second of the non-volatile storage elements undergoes Fowler-Nordheim tunneling of electrons off its floating gate. The memory cell may also include volatile storage elements and/or select transistors coupled to the non-volatile storage elements. In another embodiment a memory or other integrated circuit includes either of the above memory cells.

20 Claims, 10 Drawing Sheets